United States Patent
Mori et al.

(10) Patent No.: US 10,258,934 B2
(45) Date of Patent: Apr. 16, 2019

(54) WATERPROOF MEMBER AND ELECTRONIC DEVICE INCLUDING THE WATERPROOF MEMBER

(71) Applicant: NITTO DENKO CORPORATION, Ibaraki-shi, Osaka (JP)

(72) Inventors: Masaaki Mori, Osaka (JP); Nobuharu Kuki, Osaka (JP); Kazuaki Mochida, Osaka (JP); Yuichi Abe, Osaka (JP); Masashi Kobayashi, Osaka (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 0 days.

(21) Appl. No.: 15/325,752

(22) PCT Filed: May 22, 2015

(86) PCT No.: PCT/JP2015/002589
§ 371 (c)(1),
(2) Date: Jan. 12, 2017

(87) PCT Pub. No.: WO2016/009583
PCT Pub. Date: Jan. 21, 2016

(65) Prior Publication Data
US 2017/0157573 A1     Jun. 8, 2017

(30) Foreign Application Priority Data
Jul. 15, 2014 (JP) .................................. 2014-144755

(51) Int. Cl.
*B01D 69/10* (2006.01)
*B01D 46/10* (2006.01)
(Continued)

(52) U.S. Cl.
CPC ........... *B01D 71/36* (2013.01); *B01D 53/268* (2013.01); *G06F 1/1656* (2013.01); *H04R 1/00* (2013.01);
(Continued)

(58) Field of Classification Search
CPC .......... H05K 5/02; H05K 5/06; H05K 5/0217; H05K 5/068; H05K 5/0213; H05K 7/20;
(Continued)

(56) References Cited

U.S. PATENT DOCUMENTS 5,828,012 A * 10/1998 Repolle .................. G10K 11/18
181/175
5,914,415 A * 6/1999 Tago .................. B01D 19/0031
55/385.4
(Continued)

FOREIGN PATENT DOCUMENTS

JP        2-53115 U     4/1990
JP        05-013370 Y2  4/1993
(Continued)

OTHER PUBLICATIONS

International Search Report for PCT/JP2015/002589 dated Aug. 25, 2015 [PCT/ISA/210].
(Continued)

*Primary Examiner* — Edgardo San Martin
(74) *Attorney, Agent, or Firm* — Sughrue Mion, PLLC

(57) ABSTRACT

A waterproof member (20) includes a first adhesive layer (22), a second adhesive layer (24), and a porous layer (26). The porous layer (26) is disposed between the first adhesive layer (22) and the second adhesive layer (24). The first adhesive layer (22) and the second adhesive layer (24) each have a frame shape in plan view. When the first adhesive layer (22), the second adhesive layer (24), and the porous layer (26) are seen in plan view, the outer boundary of the
(Continued)

porous layer (26) lies within the outer boundary of the first adhesive layer (22) and the outer boundary of the second adhesive layer (24). The first adhesive layer (22) is bonded directly to the second adhesive layer (24) in a region outside the outer boundary of the porous layer (26). The porous layer (26) has a peripheral surface that is shielded from outside by the first adhesive layer (22) and the second adhesive layer (24).

15 Claims, 3 Drawing Sheets

(51) Int. Cl.
| | |
|---|---|
| *H05K 5/06* | (2006.01) |
| *B01D 71/36* | (2006.01) |
| *H04R 1/00* | (2006.01) |
| *H05K 5/02* | (2006.01) |
| *B01D 53/26* | (2006.01) |
| *G06F 1/16* | (2006.01) |
| *H04R 1/02* | (2006.01) |
| *H04R 1/08* | (2006.01) |
| *B01D 69/00* | (2006.01) |

(52) U.S. Cl.
CPC ............ *H04R 1/023* (2013.01); *H04R 1/086* (2013.01); *H05K 5/02* (2013.01); *H05K 5/06* (2013.01)

(58) Field of Classification Search
CPC . H04R 1/00; H04R 1/44; H04R 1/025; H04R 2499/11; G06F 1/1656; B01D 71/36; B01D 69/10; B01D 46/10
See application file for complete search history.

(56) References Cited

U.S. PATENT DOCUMENTS

| | | | | |
|---|---|---|---|---|
| 6,512,834 | B1* | 1/2003 | Banter | H04R 1/086 |
| | | | | 381/189 |
| 6,932,187 | B2* | 8/2005 | Banter | H04R 1/023 |
| | | | | 181/149 |
| 8,431,204 | B2* | 4/2013 | Ueki | H04R 1/023 |
| | | | | 156/247 |
| 8,512,428 | B2 | 8/2013 | Ueki et al. | |
| 8,739,926 | B1* | 6/2014 | Mori | G10K 11/18 |
| | | | | 181/286 |
| 8,986,802 | B2* | 3/2015 | Karube | B32B 7/06 |
| | | | | 428/343 |
| 9,254,467 | B2* | 2/2016 | Maruoka | B01D 67/0088 |
| 9,271,070 | B2* | 2/2016 | Abe | H04R 1/086 |
| 9,319,762 | B2 | 4/2016 | Karube et al. | |
| 9,510,097 | B1* | 11/2016 | Tsai | H04R 1/086 |
| 9,578,402 | B2* | 2/2017 | Mori | H04M 1/03 |
| 9,693,134 | B2* | 6/2017 | Karube | H04R 1/44 |
| 2015/0082984 | A1 | 3/2015 | Maruoka et al. | |
| 2017/0245036 | A1* | 8/2017 | Kuki | H04R 1/086 |

FOREIGN PATENT DOCUMENTS

| | | |
|---|---|---|
| JP | 2001-168543 A | 6/2001 |
| JP | 2002-143624 A | 5/2002 |
| JP | 2003-053872 A | 2/2003 |
| JP | 2006-142199 A | 6/2006 |
| JP | 2010-000464 A | 1/2010 |
| JP | 2012-253481 A | 12/2012 |
| JP | 2013-230459 A | 11/2013 |

OTHER PUBLICATIONS

Written Opinion for PCT/JP2015/002589 dated Aug. 25, 2015 [PCT/ISA/237].
Notification of Reasons for Refusal dated Mar. 13, 2018 from the Japanese Patent Office in counterpart Japanese application No. 2014-144755.

* cited by examiner

CONVENTIONAL ART

WATERPROOF MEMBER AND ELECTRONIC DEVICE INCLUDING THE WATERPROOF MEMBER

CROSS REFERENCE TO RELATED APPLICATIONS

This application is a National Stage of International Application No. PCT/JP2015/002589, filed May 22, 2015, claiming priority based on Japanese Patent Application No. 2014-144755, filed Jul. 15, 2014, the contents of all of which are incorporated herein by reference in their entirety.

TECHNICAL FIELD

The present invention relates to a waterproof member and an electronic device including the waterproof member.

BACKGROUND ART

Electronic devices such as mobile phones, laptop computers, electronic notebooks, digital cameras, and video game instruments usually have an audio function. Such an electronic device having an audio function includes a housing, in which is placed a sound emitting part such as a speaker or a buzzer or a sound receiving part such as a microphone. The housing is provided with an opening at a position corresponding to that of the sound emitting part or the sound receiving part. Sounds are transmitted through the opening. A sound-transmitting membrane is attached to the housing so as to cover the opening of the housing in order to prevent foreign matters such as water droplets from entering the housing. The sound-transmitting membrane allows sound to pass through but prevents foreign matters from passing through. Known examples of the sound-transmitting membrane include porous plastic membranes such as porous polytetrafluoroethylene membranes and porous ultrahigh molecular weight polyethylene membranes (see Patent Literature 1).

Patent Literature 2 describes a waterproof sound-transmitting member including a sound-transmitting membrane and a housing-side adhesive layer. The housing-side adhesive layer is a layer used to bond the waterproof sound-transmitting member to the housing and is laminated on the sound-transmitting membrane.

Patent Literature 3 describes a waterproof sound-transmitting member including a sound-transmitting membrane, a support layer, and a housing-side adhesive layer. In the waterproof sound-transmitting member described in Patent Literature 3, the entire peripheral portion of the support layer extends outwardly beyond the housing-side adhesive layer.

CITATION LIST

Patent Literature

Patent Literature 1: JP 2003-53872 A
Patent Literature 2: JP 2010-464 A
Patent Literature 3: JP 2012-253481 A

SUMMARY OF INVENTION

Technical Problem

The sound-transmitting membranes used in the waterproof sound-transmitting members of Patent Literature 2 and Patent Literature 3 each have a three-dimensional porous structure. Therefore, these sound-transmitting membranes have not only through-thickness air permeability but also in-plane air permeability. This in-plane air permeability may cause water vapor to flow into the housing. If condensation occurs in a microcircuit of an electronic device due to water vapor in the housing, it may cause the electronic device to malfunction.

A waterproof test of electronic devices (according to the IPX5 and IPX7 standards) has recently been replaced by an air tightness test in which the air flow rate is measured. If a sound-transmitting membrane used in a waterproof sound-transmitting member has in-plane air permeability, it may be difficult to perform the air tightness test accurately.

It is an object of the present invention to provide a technique for avoiding or reducing various disadvantages caused by the omnidirectional air permeability of a porous material.

Solution to Problem

The present invention provides a waterproof member including:
a first adhesive layer having a frame shape;
a second adhesive layer having a frame shape; and
a porous layer disposed between the first adhesive layer and the second adhesive layer, wherein
when the first adhesive layer, the second adhesive layer, and the porous layer are seen in plan view, an outer boundary of the porous layer lies within an outer boundary of the first adhesive layer and an outer boundary of the second adhesive layer,
the first adhesive layer is bonded directly to the second adhesive layer in a region outside the outer boundary of the porous layer, and
the porous layer has a peripheral surface that is shielded from outside by the first adhesive layer and the second adhesive layer.

Advantageous Effects of Invention

According to the present invention, the first adhesive layer is bonded directly to the second adhesive layer in a region outside the outer boundary of the porous layer. The peripheral surface of the porous layer is shielded from outside by the first adhesive layer and the second adhesive layer. With this structure, it is possible to avoid or reduce disadvantages caused by the omnidirectional air permeability of the material of the porous layer.

For example, it is possible to prevent water vapor from flowing into a housing of an electronic device through the peripheral surface of the porous layer. As a result, no condensation occurs and thus the risk of malfunction of the electronic device can be reduced. In addition, the air tightness test of the waterproof member can be performed accurately. Moreover, since the adhesive layers are bonded directly to each other, it is possible to prevent cohesive failure from occurring in the porous layer when a release liner is removed from the waterproof member or the waterproof member is removed from a backing sheet.

DESCRIPTION OF EMBODIMENTS

Hereinafter, embodiments of the present invention will be described with reference to the drawings. The present invention is not limited to the following embodiments.

Figure 1:
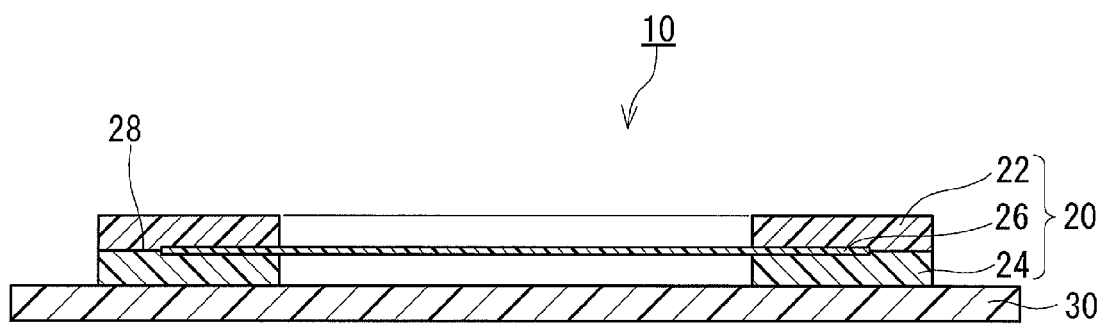
FIG. 1 is a schematic cross-sectional view of a release liner-covered waterproof member according to an embodiment of the present invention.

As shown in FIG. 1, a release liner-covered waterproof member 10 of the present embodiment includes a waterproof member 20 and a release liner 30 (tab member). The release liner 30 is attached to the waterproof member 20. After the release liner-covered waterproof member 10 is attached to a predetermined position, the release liner 30 is removed from the waterproof member 20. The release liner-covered waterproof member 10 may be attached to a backing sheet (not shown).

Figure 2:
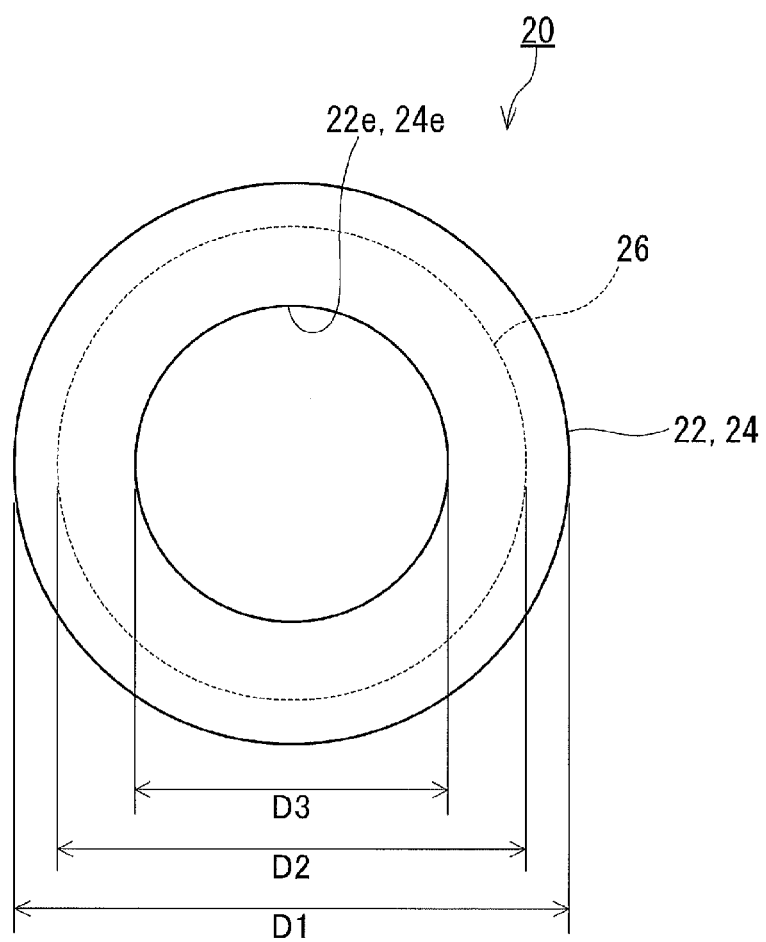
FIG. 2 is a schematic plan view of the waterproof member shown in FIG. 1.

As shown in FIG. 1 and FIG. 2, the waterproof member 20 includes a first adhesive layer 22, a second adhesive layer 24, and a porous layer 26. The porous layer 26 is disposed between the first adhesive layer 22 and the second adhesive layer 24. In the present embodiment, one of the principal surfaces (surfaces having the largest area) of the porous layer 26 is in contact with the first adhesive layer 22, and the other principal surface of the porous layer 26 is in contact with the second adhesive layer 24. Another layer may be disposed between the first adhesive layer 22 and the porous layer 26. Another layer may be disposed between the second adhesive layer 24 and the porous layer 26.

The waterproof member 20 as a whole is a waterproof sound-transmitting member in the form of a membrane. When the technique disclosed in the present description is applied to a waterproof sound-transmitting member, the effects described later can be maximized, although the application of the waterproof member 20 is not limited to waterproof sound-transmitting members. The waterproof member 20 as a sound-transmitting member is attached to a housing of an electronic device, for example. The housing is provided with an opening at a position corresponding to that of an acoustic device such as a speaker, a buzzer, a microphone, or the like. The waterproof member 20 is attached to the housing so as to cover the opening.

In the present embodiment, the waterproof member 20 has a disk shape. The first adhesive layer 22 and the second adhesive layer 24 each have a frame shape in plan view. More specifically, the first adhesive layer 22 and the second adhesive layer 24 each have an annular shape in plan view. The porous layer 26 has a disk shape with a diameter smaller than that of the adhesive layers 22 and 24. When the waterproof member 20 is seen in plan view, the centers of the first adhesive layer 22, the second adhesive layer 24, and the porous layer 26 coincide with each other. The central region of the one principal surface of the porous layer 26 is not covered by the first adhesive layer 22 and exposed to the outside air. Likewise, the central region of the other principal surface of the porous layer 26 is not covered by the second adhesive layer 24 and exposed to the outside air. The shape of the waterproof member 20 is not limited to a circular shape. For example, when the waterproof member 20 has a rectangular shape in plan view, the porous layer 26 also has a rectangular shape in plan view. The first adhesive layer 22 and the second adhesive layer 24 each have a rectangular frame shape in plan view.

When the first adhesive layer 22, the second adhesive layer 24, and the porous layer 26 are seen in plan view, the outer boundary of the porous layer 26 lies within the outer boundary of the first adhesive layer 22 and the outer boundary of the second adhesive layer 24. The first adhesive layer 22 is bonded directly to the second adhesive layer 24 in a region outside the outer boundary of the porous layer 26. The peripheral surface of the porous layer 26 is shielded from outside by the first adhesive layer 22 and the second adhesive layer 24. This means that the outer peripheral portion of the first adhesive layer 22 is in contact with the outer peripheral portion of the second adhesive layer 24 in a radial direction. When the waterproof member 20 has a disk shape, the outer diameter D1 of the first adhesive layer 22 (the outer diameter D1 of the second adhesive layer 24) is larger than the outer diameter D2 of the porous layer 26, and the outer diameter D2 of the porous layer 26 is larger than the inner diameter D3 of the first adhesive layer 22 (the inner diameter D3 of the second adhesive layer 24). The direct interface 28 between the first adhesive layer 22 and the second adhesive layer 24 has an annular shape. The width of the interface 28 ((D1−D2)/2) is 0.1 mm or more, for example. The upper limit of the width of the interface 28 is not particularly limited, and it is 5.0 mm, for example.

The waterproof member 20 of the present embodiment can prevent water vapor from flowing into an electronic device through the peripheral surface of the porous layer 26. As a result, no condensation occurs and thus the risk of malfunction of the electronic device can be reduced. In addition, the air tightness test of the waterproof member 20 can be performed accurately. Moreover, since the first adhesive layer 22 and the second adhesive layer 24 are bonded directly to each other, it is possible to prevent cohesive failure from occurring in the porous layer 26 when the release liner 30 is removed from the waterproof member 20 or the waterproof member 20 is removed from a backing sheet.

Figure 6:
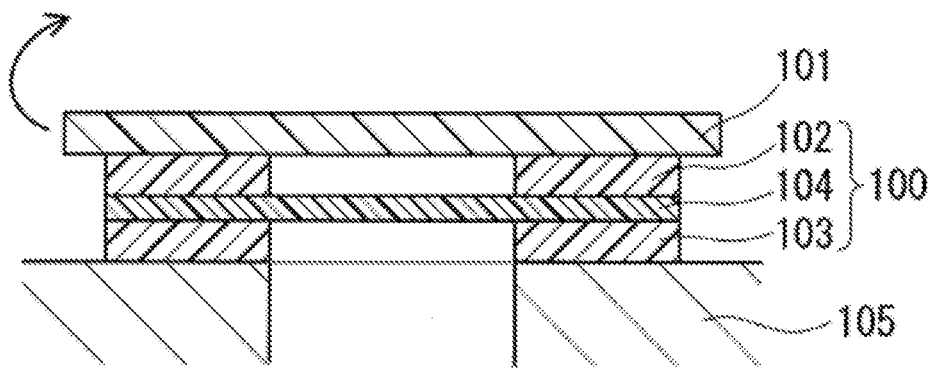
FIG. 6 is a diagram illustrating a cohesive failure that may occur in a porous layer of a conventional waterproof sound-transmitting member.
Figure 6:
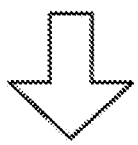
Figure 6:
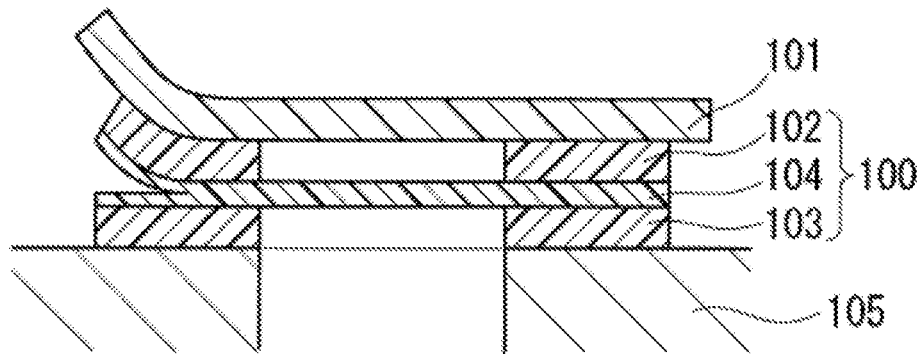

As shown in FIG. 6, in a conventional waterproof member 100 (waterproof sound-transmitting member), a first adhesive layer 102, a second adhesive layer 103, and a porous layer 104 have the same outer diameter. When the waterproof member 100 is seen in plan view, the outer boundary of the first adhesive layer 102, the outer boundary of the porous layer 104, and the outer boundary of the second adhesive layer 103 coincide with each other. When the waterproof member 100 is attached to a housing 105 and then a release liner 101 is removed from the waterproof member 100, the release liner 101 cannot be smoothly separated from the adhesive layer 102, but rather the porous layer 104 may be split in the thickness direction. This phenomenon is called "cohesive failure". In the case of the waterproof member 100, cohesive failure may occur due to the poor strength of the material (porous material) of the porous layer 104.

In contrast, according to the present embodiment, the first adhesive layer 22 and the second adhesive layer 24 are bonded directly to each other. The cohesive failure as described with reference to FIG. 6 could never occur in the porous layer 26 as long as the bonding state between the first adhesive layer 22 and the second adhesive layer 24 is maintained. The bonding between the first adhesive layer 22 and the second adhesive layer 24 is strong and cannot be easily broken.

In the present embodiment, in particular, when the waterproof member 20 is seen in plan view, the outer boundary of the porous layer 26 lies within the outer boundary of the first adhesive layer 22 and the outer boundary of the second adhesive layer 24. The entire peripheral surface, that is, the entire (360-degree) circumference of the porous layer 26 is shielded from outside by the first adhesive layer 22 and the second adhesive layer 24. Therefore, the effects described above can be obtained over the entire circumference of the waterproof member 20. To put it the other way around, the above-described effects can also be obtained when only a part of the peripheral surface of the porous layer 26 is shielded from outside by the first adhesive layer 22 and the second adhesive layer 24.

The first adhesive layer 22 is a layer having an adhesive upper surface and an adhesive lower surface. The second adhesive layer 24 also is a layer having an adhesive upper surface and an adhesive lower surface. In the present embodiment, the first adhesive layer 22 and the second adhesive layer 24 are each a double-coated adhesive tape. It is recommended to use double-coated adhesive tapes as the adhesive layers 22 and 24 because they make it easy to handle the waterproof member 20. A double-coated adhesive tape is typically composed of a substrate and two adhesive material layers. The two adhesive material layers include an adhesive material layer provided on one surface of the substrate and an adhesive material layer provided on the other surface of the substrate. The substrate is made of a resin material such as polyethylene terephthalate (PET), polyimide, polyolefin, polyvinyl chloride, or the like. The adhesive material layers are each made of an adhesive material such as an acrylic adhesive material, a silicone-based adhesive material, or the like. The double-coated adhesive tape may be a double-coated adhesive tape including no substrate. The first adhesive layer 22 and the second adhesive layer 24 may each be formed of a thermosetting resin sheet instead of a double-coated adhesive tape. The thermosetting resin sheet is made of a thermosetting resin such an acrylic resin, an epoxy resin, or the like.

In the present embodiment, the first adhesive layer 22 and the second adhesive layer 24 are made of the same material and has the same shape and the same dimensions. The thicknesses of the first adhesive layer 22 and the second adhesive layer 24 are each in the range of 0.005 to 1.0 mm, for example. The material of the first adhesive layer 22 may be different from the material of the second adhesive layer 24. The dimensions (for example, the thickness) of the first adhesive layer 22 may be different from the dimensions of the second adhesive layer 24.

The porous layer 26 is a layer made of a porous material. The porous layer 26 has the properties of allowing passage of gases such as water vapor and air and preventing passage of foreign matters such as water and dust. Examples of the porous material include a fluororesin porous body and a polyolefin porous body. Examples of the fluororesin porous body include porous bodies containing polytetrafluoroethylene (PTFE) as a main component. Examples of the polyolefin porous body include porous bodies containing ultrahigh molecular weight polyethylene (UHMWPE) as a main component. These porous materials usually have a three-dimensional porous structure. The term "ultrahigh molecular weight polyethylene" refers to a polyethylene having a weight-average molecular weight of 1,000,000 or more. The term "main component" refers to a component whose mass content is the highest of all the components.

In an example, the porous layer 26 can be a porous resin membrane containing polytetrafluoroethylene as a main component. The porous resin membrane has both through-thickness air permeability and in-plane air permeability. Therefore, when the porous layer 26 is a porous resin membrane, the technique disclosed in the present description is useful.

The porosity (void fraction) of the porous layer 26 is 30% or more, for example. When the porosity of the porous layer 26 is in the appropriate range, the air permeability of the waterproof member 20 can be sufficiently ensured. The upper limit of the porosity of the porous layer 26 is 98%, for example. Most of the pores in the porous layer 26 can be continuous pores that provide air permeability to the porous layer 26. The thickness of the porous layer 26 is, for example, in the range of 0.005 to 0.2 mm.

Figure 3:
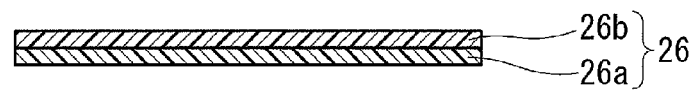
FIG. 3 is a schematic cross-sectional view of a porous membrane that may be used in the waterproof member shown in FIG. 1.

The porous layer 26 may consist only of a porous resin membrane such as a porous PTFE membrane, or may have an air-permeable supporting member as a reinforcing member. As shown in FIG. 3, the porous layer 26 can be composed of a porous resin membrane 26a and an air-permeable supporting member 26b. The air-permeable supporting member 26b is laminated on the porous resin membrane 26a. The air-permeable supporting member 26b is made of a resin material such as polyester, polyethylene, aramid, or the like. The air-permeable supporting member 26b is formed of, for example, a woven fabric, a nonwoven fabric, a mesh, a net, a sponge, a foam, or a porous body.

The release liner 30 may be made of a resin material such as polyethylene, polypropylene, polyethylene terephthalate, or the like, or may be made of paper. The release liner 30 may be attached to the first adhesive layer 22, or may be attached to the second adhesive layer 24. The release liner 30 may be attached to both the first and second adhesive layers 22 and 24.

The surface density of the waterproof member 20 is, for example, in the range of 5 to 100 $g/m^2$, and desirably in the range of 10 to 50 $g/m^2$, in view of acoustic characteristics, ease of handling, and strength. When the waterproof member 20 is used as a waterproof sound-transmitting member, it is necessary to minimize the surface density of the waterproof member 20 in view of acoustic characteristics. As the surface density increases, the sound transmission loss also increases. On the other hand, as the surface density decreases, the difficulty of handling the waterproof member 20 increases and the strength of the waterproof member 20 decreases. For example, when a long original sheet as an intermediate product of the waterproof member 20 is wound into a roll, the original sheet may wrinkle because it cannot withstand the tension applied thereto. If such a failure occurs, the production yield of the waterproof member 20 decreases. When the surface density of the waterproof member 20 is appropriately adjusted, it is possible to prevent occurrence of such a failure while obtaining excellent acoustic characteristics. In addition, it is easy to attach the waterproof member 20 to the housing.

A porous material having a low surface density has a high porosity. In other words, in such a porous material having a high porosity, the resin accounts for a small percentage of the total porous material. Such a porous material has low strength. When a punched-out article of such a porous material is handled, a release liner is often used. As described with reference to FIG. 6, when it is difficult to remove the release liner 101 from the waterproof member 100, cohesive failure may occur in the porous layer 104. In contrast, according to the present embodiment, since the first adhesive layer 22 and the second adhesive layer 24 are strongly bonded to each other, it is possible to prevent cohesive failure from occurring in the porous layer 26 even if the adhesion between the release liner 30 and the adhesive layer 24 is rather strong.

Figure 4:
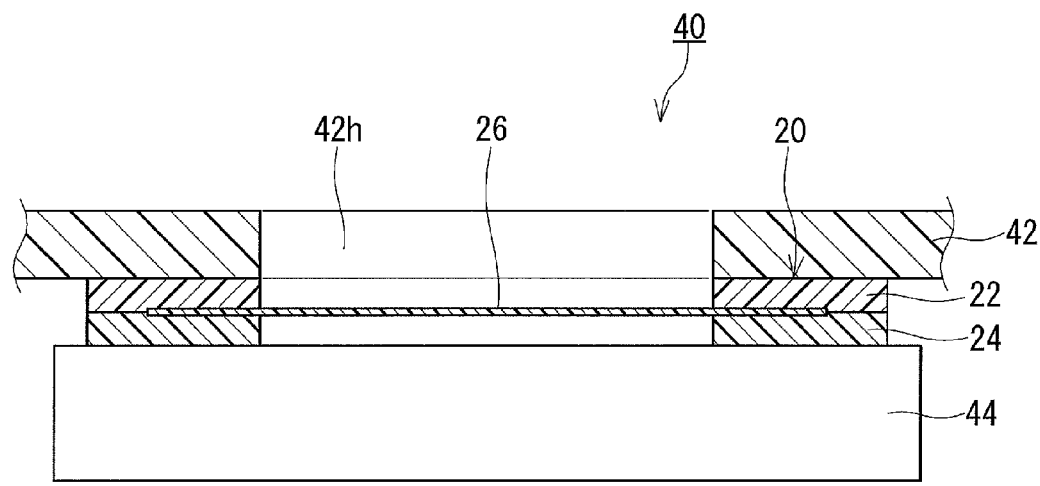
FIG. 4 is a schematic partial cross-sectional view of an electronic device including the waterproof member shown in FIG. 1.

As shown in FIG. 4, an electronic device 40 of the present embodiment includes a housing 42 and an acoustic device 44. The acoustic device 44 is placed inside the housing 42. The acoustic device 44 is, for example, a sound emitting part or a sound receiving part. The sound emitting part is, for example, a speaker, a buzzer, or the like. The sound receiving part is, for example, a microphone. The housing 42 is provided with an opening 42h at a position corresponding to that of the acoustic device 44. The waterproof member 20 is attached to the housing 42 so as to cover the opening 42h. More specifically, the waterproof member 20 covers the opening 42h from inside the housing 42. The first adhesive layer 22 is in contact with the inner surface of the housing 42, and the second adhesive layer 24 is in contact with the acoustic device 44. This means that the waterproof member 20 is disposed between the housing 42 and the acoustic device 44. The peripheral surface of the porous layer 26 is not exposed to the atmosphere inside the housing 42. Thus, if the air inside the housing 42 cannot reach the porous layer 26 through the acoustic device 44, gases such as water vapor and air cannot flow into the housing 42 from outside the housing 42.

EXAMPLES

Hereinafter, the present invention will be described more specifically by way of Examples. It should be noted that the present invention is not limited to the following Examples. The properties of porous membranes were measured by the following methods.

(Air Permeability)

The air permeability of each porous membrane was measured according to Method A (Frazier method) of air permeability measurement specified in Japanese Industrial Standards (JIS) L 1096.

(Water Entry Pressure)

The water entry pressure of each porous membrane was measured using a water penetration test apparatus (for high hydraulic pressure method) specified in JIS L 1092: 2009. When a porous membrane as a test specimen has an area specified in this standard, the porous membrane undergoes significant deformation. Therefore, in the measurement of the water entry pressure of each porous membrane, a stainless steel mesh (having an opening size of 2 mm) was placed on the surface of the porous membrane opposite to that subjected to pressure so as to reduce the deformation of the porous membrane to some extent.

(Surface Density)

A portion of each porous membrane was punched out with a 47-mm-diameter punch, and then the mass of the punched portion of the porous membrane was measured. From the mass thus measured, the mass per 1 m² was calculated to determine the surface density.

(Porosity)

The apparent density of each porous membrane was determined by multiplying the surface density by the thickness. The porosity of the porous membrane was calculated from the apparent density and the material density by the following formula. The calculation was done using 1.38 g/cm³ as the density of PET and 2.18 g/cm³ as the density of PTFE.

{1−(apparent density/material density)}×100

Example 1

A porous PTFE membrane (NTF1026 manufactured by Nitto Denko Corporation) was prepared as a porous membrane. This porous PTFE membrane had the following basic properties: a porosity of 85%; a surface density of 8.1 g/m², an air permeability of 0.31 cm³/cm²/sec; a thickness of 0.025 mm; and a water entry pressure of 250 kPa.

First, a portion of the porous membrane was punched out to obtain a piece with a diameter of 5.4 mm. On the other hand, a double-coated adhesive tape (No. 5603 manufactured by Nitto Denko Corporation, with a thickness of 0.03 mm) was laminated on a PET film with a thickness of 0.1 mm, and an opening with a diameter of 2.5 mm was formed through the adhesive tape and the PET film. The PET film was used to ensure the stiffness of the resulting waterproof member. An opening with a diameter of 2.5 mm was formed in another double-coated adhesive tape (No. 57120B manufactured by Nitto Denko Corporation, with a thickness of 0.20 mm). These two double-coated adhesive tapes were each attached to the porous membrane using a laminator so that the porous membrane was sandwiched between the two adhesive tapes to form a laminate. Then, a portion of the laminate was punched out to obtain a piece with a diameter of 5.8 mm. A release liner (a removable tape) was attached to the PET film. Thus, a waterproof member having the same structure as that shown in FIG. 1, except that a PET film (as indicated by reference numeral 32 in FIG. 5) was additionally disposed between the double-coated adhesive tape and the release liner, was obtained.

Example 2

A waterproof member was obtained in the same manner as in Example 1, except that a laminate of a porous PTFE membrane and a nonwoven fabric (NTF613AP manufactured by Nitto Denko Corporation) was used as a porous membrane. This porous PTFE membrane with a nonwoven fabric had the following basic properties: a porosity of 75% (the porosity of the porous PTFE membrane alone); a surface density of 8.5 g/m², an air permeability of 0.50 cm³/cm²/sec; a thickness of 0.025 mm; and a water entry pressure of 350 kPa.

Example 3

A waterproof member was obtained in the same manner as in Example 1, except that a porous polyethylene membrane (SUNMAP LC manufactured by Nitto Denko Corporation) was used as a porous membrane. This porous polyethylene membrane had the following basic properties: a porosity of 31%; a surface density of 62.3 g/m², an air permeability of 25 cm³/cm²/sec; a thickness of 0.100 mm; and a water entry pressure of 1 kPa.

Comparative Example 1

A waterproof member of Comparative Example 1 was obtained in the same manner as in Example 1, except that the outer diameter of a porous membrane was equal to the outer diameter of double-coated adhesive tapes.

Comparative Example 2

A waterproof member of Comparative Example 2 was obtained in the same manner as in Example 2, except that the outer diameter of a porous membrane was equal to the outer diameter of double-coated adhesive tapes.

Comparative Example 3

A waterproof member of Comparative Example 3 was obtained in the same manner as in Example 3, except that the outer diameter of a porous membrane was equal to the outer diameter of double-coated adhesive tapes.

(Air Tightness Test)

Figure 5:
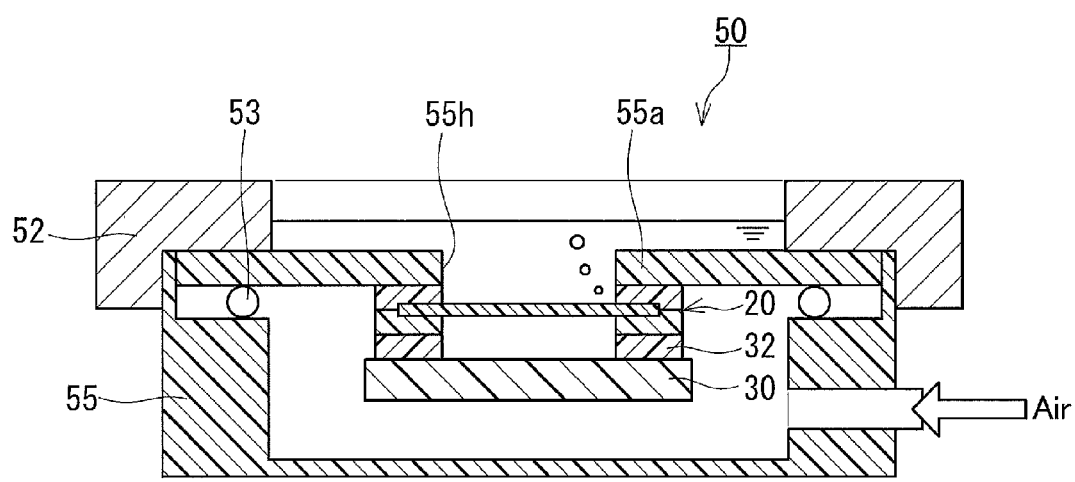
FIG. 5 is a diagram illustrating how to perform an air tightness test.

The air tightness test of each waterproof member was performed using a test apparatus 50 shown in FIG. 5. The test apparatus 50 includes a housing 55, an O-ring 53, and a pressing tool 52. An opening 55h with a diameter of 2 mm is formed in a lid portion 55a of the housing 55. A waterproof member was attached to the inner surface of the housing 55 so as to cover the opening 55h. The housing 55 was sealed with the O-ring 53 and the pressing tool 52. A recess formed in the upper part of the housing 55 was filled with distilled water so that the waterproof member came into contact with the water through the opening 55h. Then, the air inside the housing 55 was compressed to a pressure of 200 kPa. One minute later, generation of air bubbles was observed. A waterproof member was determined not to have airtightness when air bubbles were generated, and a waterproof member was determined to have airtightness when no air bubbles were generated. Table 1 shows the results.

TABLE 1

|  | Porous membrane | Air permeability [$cm^3/cm^2/sec$] | Porosity [%] | Airtightness |
|---|---|---|---|---|
| Example 1 | NTF1026 | 0.31 | 85 | Yes |
| Example 2 | NTF613AP | 0.50 | 75 | Yes |
| Example 3 | SUNMAP LC | 25.00 | 31 | Yes |
| Com. Example 1 | NTF1026 | 0.31 | 85 | No |
| Com. Example 2 | NTF613AP | 0.50 | 75 | No |
| Com. Example 3 | SUNMAP LC | 25.00 | 31 | No |

As shown in Table 1, the waterproof members of Examples 1 to 3 had airtightness, while the waterproof members of Comparative Examples 1 to 3 lacked airtightness.

INDUSTRIAL APPLICABILITY

The technique disclosed in the present description can be used to provide waterproof protection to electronic devices such as mobile phones, laptop computers, electronic notebooks, digital cameras, and video game instruments. The range of application of the technique disclosed in the present description is not limited to electronic devices. The technique disclosed in the present description can also be used to provide waterproof protection to housings of products without an audio function, for example, automotive components such as sensors, switches, and ECUs.

The invention claimed is:

1. A waterproof member comprising:
a first adhesive layer having a frame shape;
a second adhesive layer having a frame shape; and
a porous layer disposed between the first adhesive layer and the second adhesive layer, wherein
when the first adhesive layer, the second adhesive layer, and the porous layer are seen in plan view, an outer boundary of the porous layer lies within an outer boundary of the first adhesive layer and an outer boundary of the second adhesive layer,
the first adhesive layer is bonded directly to the second adhesive layer in a region outside the outer boundary of the porous layer, and
the porous layer has a peripheral surface that is shielded from outside by the first adhesive layer and the second adhesive layer.

2. The waterproof member according to claim 1, wherein the outer boundary of the porous layer lies entirely within the outer boundary of the first adhesive layer and the outer boundary of the second adhesive layer.

3. The waterproof member according to claim 1, wherein the porous layer is a porous resin membrane containing polytetrafluoroethylene as a main component or a laminate of the porous resin membrane and an air-permeable supporting member.

4. The waterproof member according to claim 1, wherein the porous layer has a porosity of 30% or more.

5. The waterproof member according to claim 1, wherein the waterproof member as a whole is a waterproof sound-transmitting member in the form of a membrane.

6. The waterproof member according to claim 1, wherein the first adhesive layer and the second adhesive layer are each a double-coated adhesive tape.

7. A release liner-covered waterproof member comprising:
the waterproof member according to claim 1; and
a release liner attached to the first adhesive layer or the second adhesive layer of the waterproof member.

8. An electronic device comprising:
a housing;
a sound emitting part or a sound receiving part disposed inside the housing; and
the waterproof member according to claim 5 that is attached to the housing so as to cover an opening of the housing formed at a position corresponding to that of the sound emitting part or the sound receiving part.

9. The waterproof member according to claim 6, wherein the double-coated adhesive tape comprises a substrate, an adhesive material layer provided on one surface of the substrate, and another adhesive material layer provided on the other surface of the substrate.

10. The waterproof member according to claim 1, wherein the entire peripheral surface of the porous layer is shielded from outside by the first adhesive layer and the second adhesive layer.

11. The waterproof member according to claim 1, wherein the first adhesive layer has an annular shape in plan view, the second adhesive layer has an annular shape in plan view, and
a relationship (D1−D2)<(D2−D3) is satisfied, where D1 denotes an outer diameter of the first adhesive layer and the second adhesive layer, D2 denotes an outer diameter of the porous layer, and D3 denotes an inner diameter of the first adhesive layer and the second adhesive layer.

12. The waterproof member according to claim 1, wherein an upper surface of the first adhesive layer forms an uppermost surface of the waterproof member, and a lower surface of the second adhesive layer forms a lowermost surface of the waterproof member.

13. The waterproof member according to claim 1, wherein an upper surface of the first adhesive layer serves as an adhesive surface between the waterproof member and another member, and a lower surface of the second adhesive layer serves as an adhesive surface between the waterproof member and still another member.

14. The waterproof member according to claim 1, wherein the peripheral surface of the porous layer is in contact with the first adhesive layer and/or the second adhesive layer.

15. The release liner-covered waterproof member according to claim 7, wherein
- the release liner is attached to the first adhesive layer of the waterproof member, and
- the release liner-covered waterproof member further comprises a backing sheet attached to the second adhesive layer of the waterproof member.

\* \* \* \* \*